US006718272B1

(12) United States Patent
Fisk, II et al.

(10) Patent No.: US 6,718,272 B1
(45) Date of Patent: Apr. 6, 2004

(54) FAST TRANSIENT PROTECTION FOR RF PLASMA GENERATOR

(75) Inventors: Larry James Fisk, II, West Henrietta, NY (US); William John VanRemmen, Jr., Geneseo, NY (US); Kevin Peter Nasman, N. Chili, NY (US)

(73) Assignee: ENI Technology Inc., Rochester, NY (US)

( * ) Notice: Subject to any disclaimer, the term of this patent is extended or adjusted under 35 U.S.C. 154(b) by 171 days.

(21) Appl. No.: 09/703,976

(22) Filed: Nov. 1, 2000

(51) Int. Cl.[7] ............................................. G06F 15/54
(52) U.S. Cl. ............................. 702/58; 702/59; 702/60; 702/69; 702/189; 702/4; 702/124
(58) Field of Search .................................. 702/4, 57–59, 702/66, 69, 70, 73, 74, 60–62, 78, 79, 110, 111, 122, 124, 126, 117, 189–191, 197, 198, FOR 103–104, FOR 106, FOR 109, FOR 110, FOR 164, FOR 134–135, FOR 166, FOR 170–171; 700/292, 293, 294, 286, 73, 74; 340/539, 531, 511; 341/122, 132; 361/111, 93.2, 91.1, 93.1; 324/72

(56) References Cited

U.S. PATENT DOCUMENTS

| 4,804,490 A | * | 2/1989 | Pryor et al. ............. 204/192.25 |
| 5,049,816 A | * | 9/1991 | Moslehi ....................... 324/767 |
| 5,170,359 A | * | 12/1992 | Sax et al. ..................... 324/102 |
| 5,483,153 A | * | 1/1996 | Leeb et al. .................. 324/102 |
| 5,955,884 A | * | 9/1999 | Payton et al. ................ 324/339 |
| 5,971,712 A | * | 10/1999 | Kann ............................. 417/18 |
| 5,986,439 A | * | 11/1999 | Pletta et al. .................. 322/18 |
| 5,999,392 A | * | 12/1999 | Sung et al. ................... 361/111 |
| 6,033,482 A | * | 3/2000 | Parkhe ........................ 118/728 |
| 6,112,136 A | * | 8/2000 | Paul et al. ................... 700/293 |
| 6,232,755 B1 | * | 5/2001 | Zhang ........................ 323/282 |
| 6,355,570 B1 | * | 3/2002 | Nakata et al. .............. 438/706 |
| 6,424,927 B1 | * | 7/2002 | Sechi et al. ................. 702/126 |
| 2001/0000956 A1 | * | 5/2001 | Honda et al. ................. 338/34 |

FOREIGN PATENT DOCUMENTS

| JP | 57119166 A | * | 7/1982 | ............. F02P/15/00 |
| JP | 04026781 A | * | 1/1992 | ............. C23F/4/00 |

* cited by examiner

*Primary Examiner*—Marc S. Hoff
*Assistant Examiner*—Carol S Tsai
(74) *Attorney, Agent, or Firm*—Bryan Cave LLP (57) ABSTRACT

An apparatus and method for the detection of and recovery from a plurality of electrical transients in a plasma generator system is disclosed. The plasma generator system comprises a plasma chamber and a power amplifier is provided, wherein the apparatus comprises a sensor, the sensor detects an electrical transient in the electrical transients and outputs a first signal when the electrical transient is detected. The system also includes a first circuitry for receiving the first signal, the circuitry controlling said power output from said power amplifier in response to the first signal and outputting a second signal communicating the controlled power output, and a second circuitry for receiving the second signal, the second circuitry outputting a reset signal to the first circuitry, wherein the first circuitry receives the reset signal and resets the power output in response to the reset signal.

26 Claims, 5 Drawing Sheets

FAST TRANSIENT PROTECTION FOR RF PLASMA GENERATOR

FIELD OF THE INVENTION

This invention relates to plasma generation equipment and techniques, and it is particularly directed to a method and apparatus for the quick protection and recovery from load transients, and protecting circuitry in plasma generation equipment from transient current and voltage peaks originating in the plasma chamber.

BACKGROUND OF THE INVENTION

It has long been understood in the field of plasma generation that, extremely short and high power load transients may occur. The design of plasma generators, therefore, must afford the generator circuitry protection from such destructive transients. Moreover, such a system must be capable of reacting extremely quickly in recognizing and recovering from such transients, as those transients may be extremely brief. It is similarly advantageous for such a system to guarantee that the control system associated with the plasma generator is informed each and every time a transient occurs. This would allow the control system of the plasma generator to restore output power to its pre-transient set-point as rapidly as possible.

In a typical RF plasma generator arrangement, a generator supplies forward power to the plasma chamber. A portion of the forward power is reflected back towards the generator, as reverse, or reflected power. Conditions may occur, however, that can cause transient peaks in the reflected power. These transient peaks can cause excessive current or voltage peaks in the generator. These peaks are unpredictable, and are of such amplitude that they pose a threat to the integrity of circuits within the plasma generation equipment. Detection, effective countermeasures, and quick recovery from such transient peaks, therefore, is an important aspect of the design of plasma generation equipment.

Typical plasma generator protection schemes, however, merely focus on the cut-off of the input power (and therefore the output) to the plasma generator in order to protect the generator circuitry from damage. As will be discussed below, this protection scheme suffers from several disadvantages.

Figure 1:
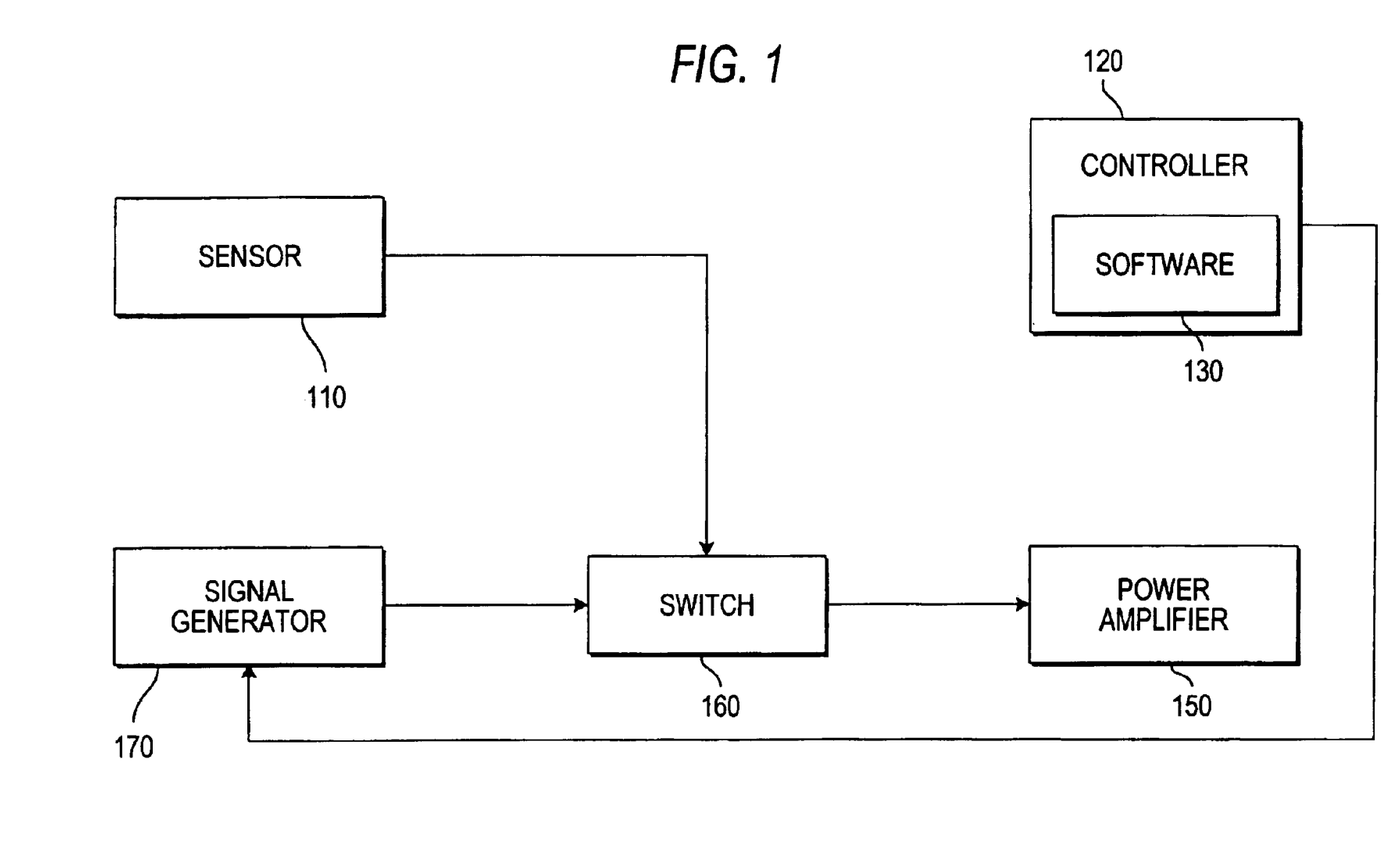
FIG. 1 is a block diagram of a transient protection scheme.

FIG. 1 depicts a block diagram of a typical transient protection scheme. This protection circuitry works on the aforementioned principle of simply shutting down the drive to the power amplifier 150 upon detection of a transient. When the sensor 110 detects a transient, it will turn off the drive to the power amplifier 150 via the switch 160.

Although this design may operate to protect the power amplifier circuitry from damage due to transients in the plasma chamber, it suffers from several shortcomings. Most important of these shortcomings is that, due to the rapid rise and short duration of some transients, there is a substantial probability that the controller 120 will not be able to react quickly enough to acknowledge that a transient has occurred. Accordingly, the response time of the protection system, from the time the transient occurs to the time the protection system restores power output to its previous levels, may be unacceptably long.

Additionally, the inability of present systems to acknowledge all transients may have damaging effects on the plasma generator's circuitry. For example, if the controller 120 does not react quickly enough to realize that a transient has occurred, the software will also be unaware that a transient has occurred. Thus, the control software 130 will only realize that the power output from the power amplifier 150 has either diminished, or has shut off completely, since the input power to the power amplifier 150 has been cut by sensor 110. Accordingly, and in reaction to the above situation, a cascade effect will occur that may damage the circuitry of the system. That is, the software 130, unaware that input power was cut-off due to the transient, will increase its own internal parameters in an attempt to produce more power out of the generator in order to meet its present power set-point. Thus, when the transient actually does subside and the sensor 110 restores input power to the power amplifier, the software's 130 internal control parameters will have been driven to a very high level; much higher than before the transient occurred. This may result in a second transient, which may destroy the circuit elements of the plasma generator.

Furthermore, since there is no guarantee that the software will be capable of reacting to each and every transient, accurate reporting of these transients is impossible. Thus, although it would be desirable to report on the frequency of transients within the system, such reporting is not possible using a protection scheme that cannot guarantee recognition of virtually each and every transient.

Accordingly, although present cut-off protection schemes offer at least some level of protection to power amplifier circuitry from the occurrence of transients, they are lacking in several respects. Most importantly, they are incapable of reacting quickly enough to realize that a transient has even occurred, and will have an unacceptable delay time from the point the transient is detected, to the point where output power from the power amplifier is turned off. Additionally, since present detection systems are incapable of reliably detecting transients, they can react incorrectly to the protective cut-off and produce a second equally destructive transient. Also, they cannot provide accurate reports of the occurrence of the transients, which would greatly aid in the design and improvement of plasma generator and plasma chamber design.

It is thus an object of the present application to solve these and many other problems. This object, and many other features and advantages of this invention will become apparent from the ensuing description.

SUMMARY OF THE INVENTION

According to one embodiment of the present invention, an apparatus is disclosed for the detection of and recovery from a plurality of electrical transients in a plasma generator system, said plasma generator system comprising a plasma chamber and a power amplifier is provided, wherein said apparatus comprises a sensor, said sensor detecting an electrical transient in said plurality of electrical transients and outputting a first signal when said electrical transient is detected, a first circuitry for receiving said first signal, said first circuitry controlling said power output from said power amplifier in response to the first signal and outputting a second signal communicating the controlled power output, and a second circuitry for receiving said second signal, said second circuitry outputting a reset signal to said first circuitry, wherein said first circuitry receives said reset signal and resets said power output in response to said reset signal.

A method is also disclosed for the detection of and recovery from a plurality of electrical transients in a plasma generator system is provided, wherein said plasma generator system comprises a plasma chamber and a power amplifier, said method comprising the steps of detecting an electrical transient in said plurality of electrical transients in said plasma generator system, controlling the output power so as to protect the system, signaling a processor that said transient has occurred, sending a signal from said processor to a control software program, said signal from said processor to said control software program being sent each time a transient is detected in said plurality of transients; said control software program controlling the output of said plasma generator system until said output is stabilized, said control software program outputting a reset signal to said processor, said reset signal indicating that said output of said plasma generator is stabilized.

DETAILED DESCRIPTION

Figure 2:
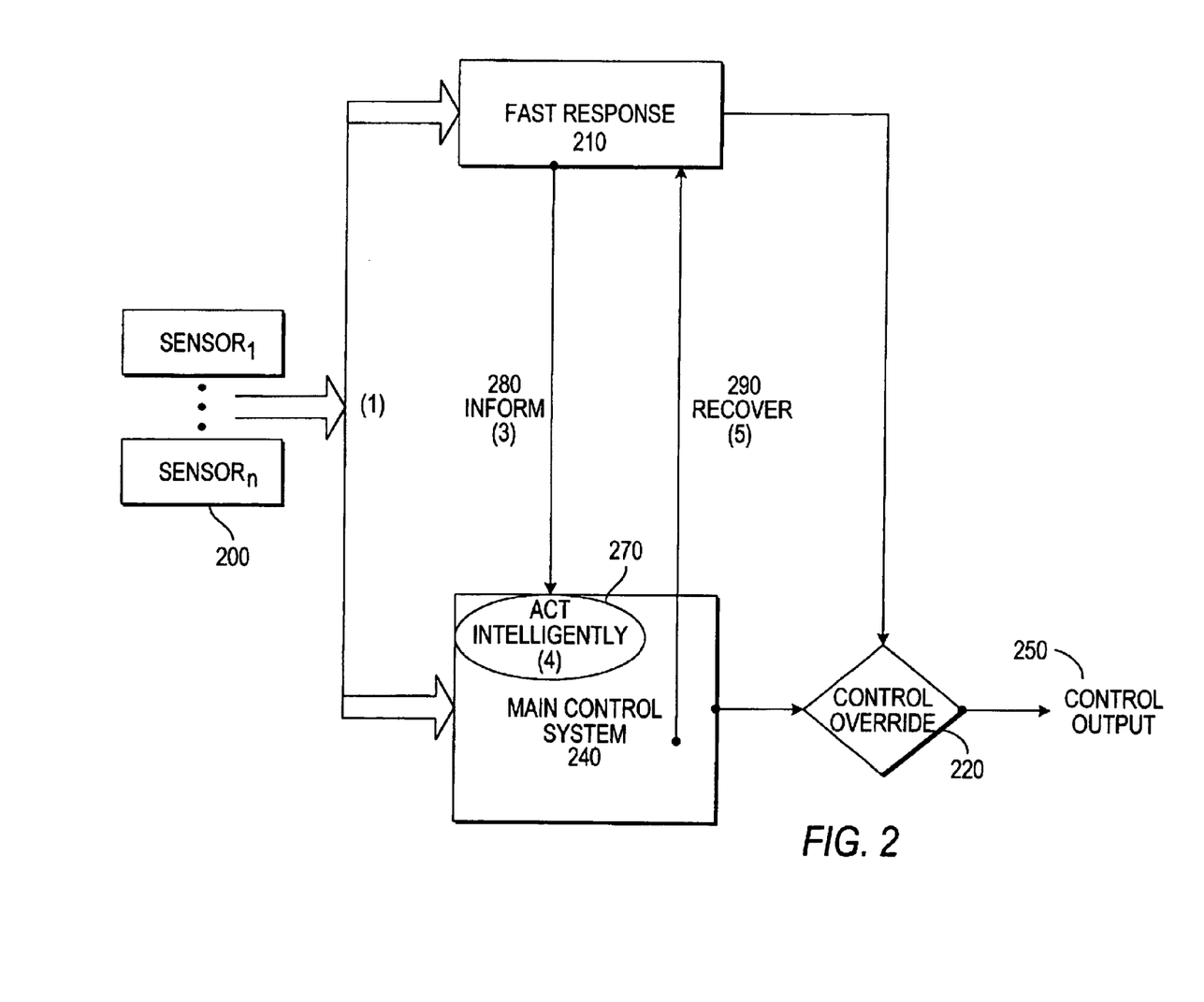
FIG. 2 is a general block diagram of the present invention.

Referring now to FIG. 2, a general block diagram of the present invention is shown. Generally, the Fast Transient Recovery system (FTR) of the present invention comprises three main systems; a sensor circuit 200, which may comprise one or more sensors monitoring for harmful transient conditions, a fast response circuit 210 and a control system 240. The sensor circuit 200 detects a transient condition within the system based on set-point parameters for the general operation of the plasma generator system. The sensor circuit communicates this condition to the fast response circuit 210 to override 220 the control output 250 and modify the control output signal. The fast response circuit 210 then signals main control system 240 as an inform output 280 that its has acted to modify the output, this inform signal 280 is processed by a reactive portion 270 of the main control system 240, which may be a "smart" system, i.e. digital microprocessor based application running pursuant to a software algorithm or an analog circuit. Based on this signal from the fast response system 210, main control system 240 then operates to recover from the transient event and to re-initiate the original signal, which may be in turn modified depending whether a "soft" or "hard" start-up is desired. In so doing, main control system 240 sends a recover signal 290 to fast response system 210 to clear the override condition and reassert control over the control output signal.

Figure 3:
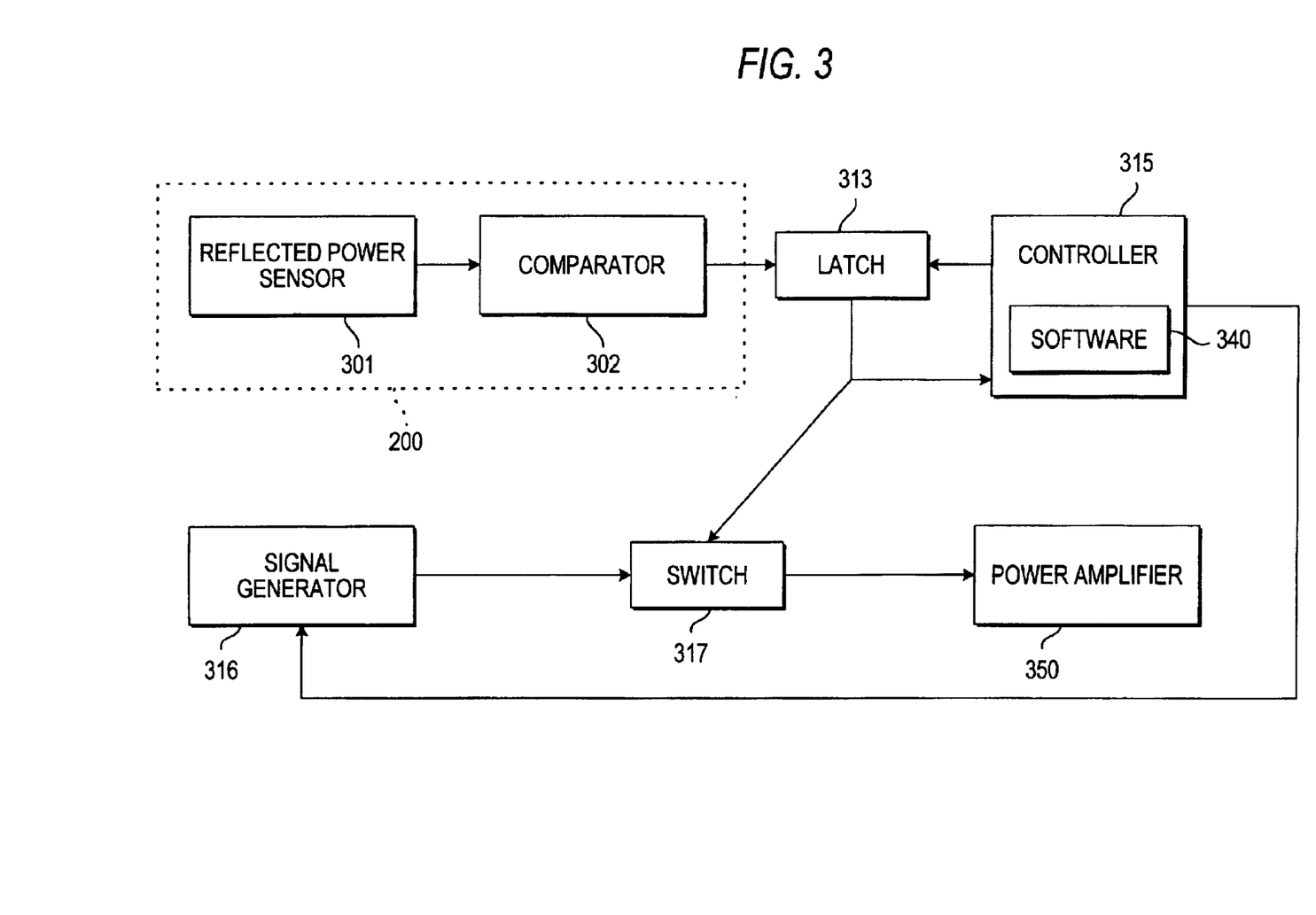
FIG. 3 is a block diagram of a first embodiment of the present invention.

As is more particularly depicted in FIG. 3, a block diagram of a first embodiment of the present invention, the sensor circuit 200 generally comprises a power sensor 301, and a fast comparator 302. The control override portion 220 generally comprises a latch, a Processor (CPU) 315, a signal generator 316, and a switch 317.

The operation of the embodiment of the present invention depicted in FIG. 3 is as follows. The power sensor 301 in the sensor circuitry 200 is capable of detecting a fast reverse peak condition in the reverse power. The power sensor 301 may be any sensor device capable of detecting a fast reverse peak condition; for example, the power sensor 301 may be any suitable type of commercially available directional coupler. The sensor circuitry also comprises a fast comparator 302. In a preferred embodiment, the fast comparator 302 may be a National Semiconductor LT 1116, available from Linear Technologies. The comparator may be pre-set for any threshold value, depending on the type of generator to be protected. Thus, the FTR of the present invention may be tailored to meet the protection needs of different types of generators by being adjusted relative to the load conditions and power level of the plasma generator equipment. Upon detection of a transient signal that exceeds the threshold value of the comparator, the comparator 302 will output a signal to the latch 313. This indicates that a transient is occurring. The latch can be any suitable type of commercially available latch. Subsequently, once a transient of sufficient amplitude has been detected, the latch will output a signal to the switch, which will in turn cut-off the drive signal to the power amplifier 350, thereby protecting the circuits of the plasma generator.

Meanwhile, once the latch has been set by the occurrence of a transient, it stays in its 'set' state until it is reset. Only the CPU 315 can reset the latch. The CPU may be any suitable, commercially available CPU. By giving control of the reset of the latch 313 to the CPU 315, the CPU 315 is guaranteed to be notified of all transients, regardless of their brevity. This in turn ensures that the software 340 is also aware that a transient has occurred, each and every time one occurs. This allows the software 340 to modify its own internal parameters accordingly throughout the duration of the transient. The CPU 15 will retain control over the latch 313 until it receives notification from the software 340 that the output power of the power amplifier has been stabilized. By doing so, this allows the software 340 enough control to most efficiently adjust its internal control parameters. Once the CPU 315 has sent a reset signal to the latch 313, the latch 313 outputs a signal to the switch 317 which restarts the input to the power amplifier 350.

For example, upon receiving a signal from the sensor 401 of sufficient amplitude to meet its pre-set thresholds, the comparator 302 will output a signal to the latch 313. The latch 313 is set once it receives the signal from the fast comparator 311, which indicates that a transient is occurring. The latch will not be reset until it receives a reset signal from the CPU 315. The comparator 302 also outputs a signal to the signal generator 316, which causes the switch 317 to cut input power to the power amplifier 350. The latch 313 outputs a signal to the CPU 315 which indicates that the transient has occurred. Upon receiving the signal from the latch 313, the CPU 315 outputs a signal to the software 340. The software is now aware that a transient is occurring, and can adjust its control parameters accordingly.

Once the transient has subsided, the FTR system of the present invention can quickly stabilize the power output to its pre-transient set-point, and output a signal to the switch 317 to reestablish input power to the power amplifier 350. As discussed above, without the FTR system of the present invention, the transient may have occurred far too quickly for the CPU to react. Thus, the software would not have been informed that a cut-off of input power had occurred, which could have caused the software to ramp up its control parameters in response to the cut off situation. This, in turn, would have caused a secondary spike once the transient had subsided, and recovery was attempted. In the FTR system of the present application, the CPU has sole control over the resetting of the latch 313. Accordingly, the software 340 is guaranteed to be informed of each and every transient as it occurs, and will level its control parameters through the transient. Thus, since the control parameters of the software 340 will not be 'ramped up' (i.e., the control parameters will not be unintelligently reacting to a cut-off situation, thereby requesting substantially more power than is actually required), quick recovery to normal power levels once the transient has subsided is possible.

Furthermore, and more importantly, the time in which the FTR system of the present invention can restore output to its pre-transient set-point level after the transient has occurred is extremely fast. This is due to the fact that the design of the present invention allows CPU and software to intelligently manage their internal parameters during the transient such that they can recover quickly after the transient.

The speed of recovery of the present invention has been illustrated by experimentation. For the purposes of one experiment power amplifier 350 is run at full power, or 5 kilowatts, into a 50Ω load. The output is connected through a length of coaxial cable to a large relay in series with the 50Ω load. In order to simulate the harshest possible transient, at 2 milliseconds into the experiment, a load transient is simulated by opening the relay.

Shortly after 2 milliseconds the power clamps close to 0 kilowatts, as a result of the initial transient. However, in less than 2 milliseconds, the FTR system has enabled the software control algorithms to stabilize the power output of the generator, even though its output is terminated in an open circuit. At this point the relay is closed, and the output is switched back to a 50Ω load. The FTR system, thus, allows the software to stabilize the output of the plasma generator within roughly 5 milliseconds.

The FTR system of the present invention also includes several other distinct advantages. Due to the speed in which the FTR system can react to transients, individual circuit elements are protected from excessive voltages and currents, thus increasing their longevity and reliability. Moreover, the elements of the present system are frequency independent, and adaptable to any power level facilitating manufacture and universal acceptance. Additionally, since the software is guaranteed to receive notification each and every time a transient occurs, the software can accurately report on the number of times the FTR is used to recover from a transient. This is advantageous, since it may be desirable to compare the number of times the FTR system is used to chamber arcing, for example, in order to optimize operation of the plasma chamber. An accurate correlation could only be made using a system that is guaranteed to sense and record every transient.

Figure 4:
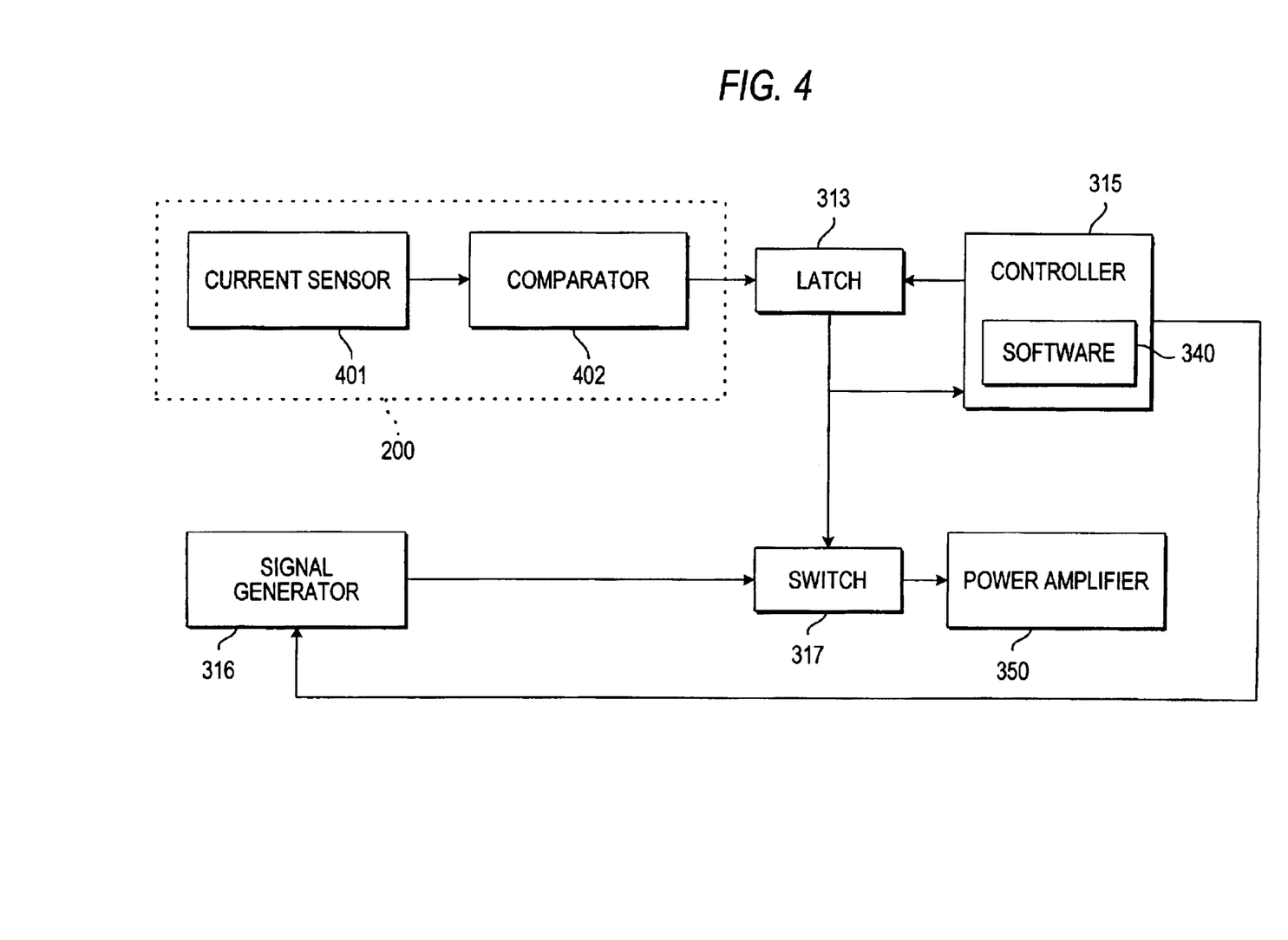
FIG. 4 is a block diagram of a second embodiment of the present invention.

FIG. 4 depicts a first alternative embodiment of the present invention. In this embodiment the power sensor 301 of FIG. 3 is replaced with current sensor 401. Although the operation of the FTR System remains essentially the same, replacing the power sensor 301 with the current sensor 401 allows the added versatility of sensing for an over current condition in the power supply, providing protection against an over current condition, and providing quick recovery after the condition has subsided.

Figure 5:
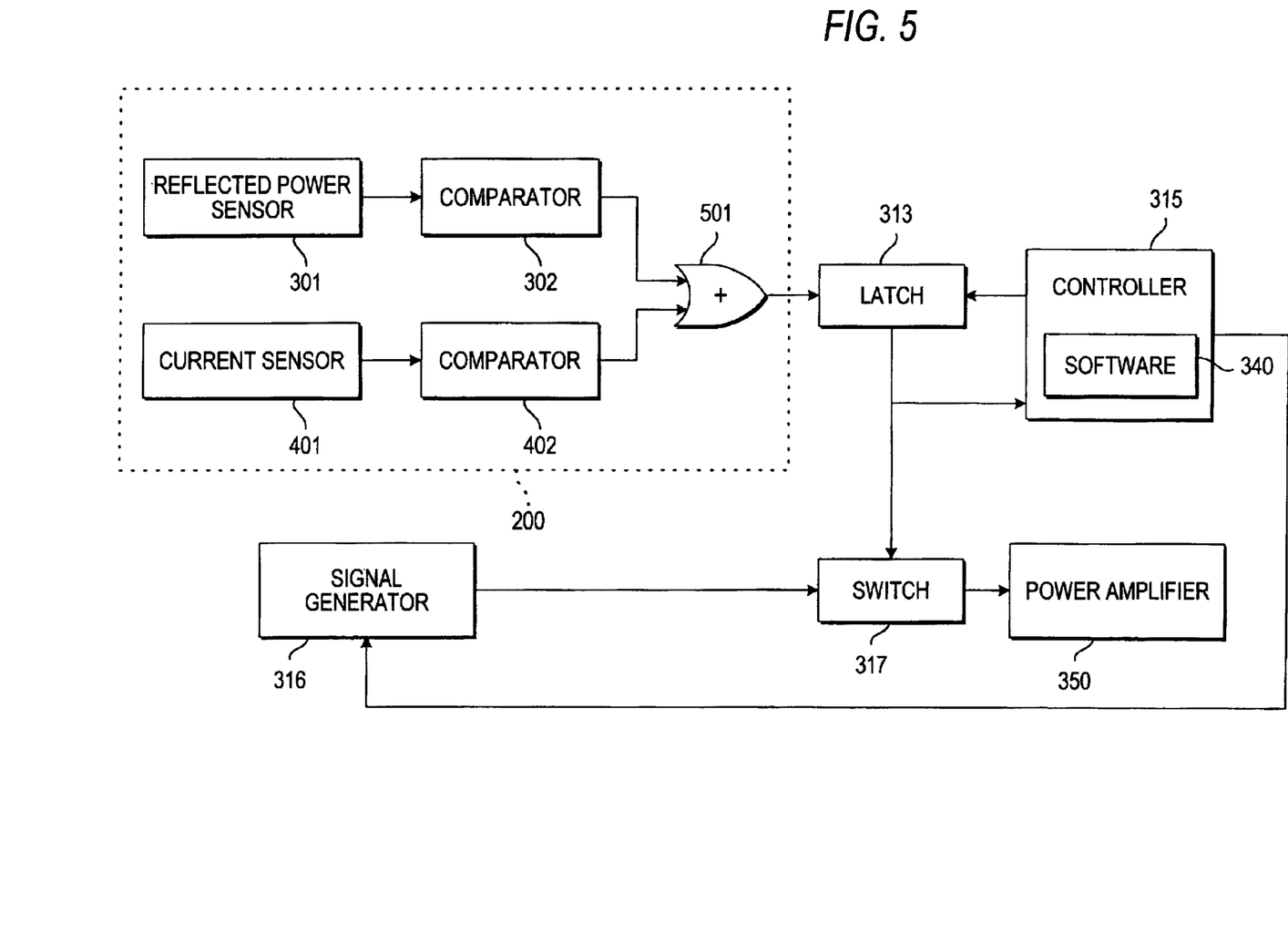
FIG. 5 is a block diagram of a third embodiment of the present invention.

FIG. 5 depicts yet another alternative embodiment of the present invention. In this embodiment, protection against both over current and reverse peak transients is provided, through the addition of logical OR gate 501. A current or reverse power transient of sufficient magnitude will cause an output signal from their respective comparators. This signal will in turn be output to the logical OR gate 501. The logical OR gate will then output the signal to the latch 313, indicating that a transient in the reverse power or in the supplied current, or both, has occurred. Thus, the FTR system will be able to react to and recover from either an over current or reverse power transient.

While the invention has been described in respect to the above embodiments of the invention, it should be understood that the invention is not limited to these precise embodiments. Rather, many modifications and variations will present themselves to persons skilled in the art without departure from the scope and spirit of the inventions, which is defined in the appended claims.

We claim:

1. An apparatus for the detection of and recovery from a plurality of electrical load transients in a plasma generator system, said plasma generator system comprising a plasma chamber and a power amplifier providing a power output to the plasma chamber, said apparatus comprising:

a sensor, said sensor detecting an electrical transient in said plurality of electrical transients and outputting a first signal when said electrical transient is detected;

a first circuitry for receiving said first signal, said first circuitry controlling said power output from said power amplifier in response to the first signal and outputting a second signal communicating the controlled power output; and, a second circuitry for receiving said second signal, said second circuitry outputting a reset signal to said first circuitry, wherein said first circuitry receives said reset signal and resets said power output in response to said reset signal.

2. The apparatus of claim 1, wherein at least one of said first circuitry and second circuitry is an analog circuit.

3. The apparatus of claim 1, wherein said second circuitry is a processor operated through parameters within a software program.

4. The apparatus of claim 1, wherein said sensor comprises means for detecting the level of any reflected power from said plasma chamber.

5. The apparatus of claim 4, wherein said sensor further comprises a comparator, said comparator comprising a pre-set value, said comparator comprising means for receiving an output from said sensor, comparing said output to said pre-set value, and outputting a third signal to said second circuitry when said output from said sensor is greater than said pre-set value, said third signal indicating that said transient has been detected.

6. The apparatus of claim 1, wherein the first circuitry further comprises a switch and wherein when said output from said sensor is greater than said pre-set value, said comparator outputs a cut-off signal to said switch, said cut-off signal cutting off input power to said power amplifier.

7. The apparatus of claim 1, wherein said sensor detects current levels in power supplied to the power amplifier.

8. The apparatus of claim 7 wherein said sensor further comprises a comparator, said comparator comprising a pre-set value, said comparator comprising means for receiving said output from said sensor, comparing said output to said pre-set value, and outputting a third signal to said processor when said output from said sensor is greater than said pre-set value.

9. The apparatus of claim 8 wherein when said output from said sensor is greater than said pre-set value, said comparator outputs a cut-off signal to said switch, said cut-off signal cutting off input power to said power amplifier.

10. The apparatus of claim 1 wherein said sensor further comprises a power sensor and a current sensor.

11. The apparatus of claim 10 wherein said sensor further comprises a first comparator, a second comparator, and a logical OR gate, said first comparator comprising a first pre-set value; said first comparator receiving said output from said power sensor, comparing said output to said first pre-set value, and outputting a fourth signal to said logical OR gate when said output from said power sensor is greater than said first pre-set value; said second comparator comprising a second pre-set value; said second comparator comprising means for receiving said output from said current sensor, comparing said output to said second pre-set value, and outputting a fifth signal to said logical OR gate when said output from said current sensor is greater than said second pre-set value; said logical OR gate outputting a signal to said first circuitry when said logical OR gate receives said fourth signal or said fifth signal.

12. A detection and protection means for the detection of and recovery from a plurality of electrical transients in a plasma generator means for producing plasma, said plasma generator system comprising a plasma chamber means for containing said produced plasma, and an amplifier means for amplifying power, said detection and protection means comprising:

a sensing means for detecting an electrical transient in said plurality of electrical transients and outputting a first signal when said electrical transient is detected;

a processing means for processing, said processing means comprising means for receiving said first signal and outputting a second signal, said receiving means of processing means receiving said first signal every time said sensor detects in said plurality of electrical transients a transient, and;

software control means for controlling power output from said plasma generator means, said software control means comprising means for receiving said second signal, said amplifier means providing a power output, said software control means controlling said power output from said amplifier means and outputting a reset signal to said processor means when said software control means has stabilized said power output; said software receiving said second signal every time said sensor detects said transient.

13. The detection and protection means of claim 12, wherein said sensor means comprises means for detecting power levels in any reflected power from said chamber means.

14. The detection and protection means of claim 12, wherein said sensor means further comprises a comparing means for comparing values, said comparing means comprising a pre-set value, said comparing means comprising means for receiving an output from said sensor means, comparing said output to said pre-set value, and outputting a third signal to said processor means when said output from said sensor means is greater than said pre-set value, said third signal indicating that said transient has been detected.

15. The detection and protection means of claim 13, wherein when said output from said sensor means is greater than said pre-set value, said comparing means outputs a cut-off signal to said switch means, said cut-off signal cutting off input power to said amplifier means.

16. The detection and protection means of claim 12, wherein said sensor means detects current levels in power supplied to the amplifier means.

17. The detection and protection means of claim 15 wherein said sensor means further comprises a comparing means for comparing values, said comparing means comprising a pre-set value, said comparing means comprising means for receiving said output from said sensor means, comparing said output to said pre-set value, and outputting a third signal to said processor means when said output from said sensor means is greater than said pre-set value.

18. The detection and protection means of claim 16 wherein when said output from said sensor means is greater than said pre-set value, said comparing means outputs a cut-off signal to said switch means, said cut-off signal cutting off input power to said amplifier means.

19. The detection and protection means of claim 12 wherein said sensor means further comprises a reflected power sensor means for detecting reflected power and a current sensor means for detecting current.

20. The detection and protection means of claim 16 wherein said sensor means further comprises a first comparing means for comparing values, a second comparing means for comparing values, and a logic means for performing logical OR functions, said first comparing means comprising a first pre-set value; said first comparing means receiving said output from said reflected power sensor means, comparing said output to said first pre-set value, and outputting a fourth signal to said logical means when said output from said reflected power sensor means is greater than said first pre-set value; said second comparing means comprising a second pre-set value; said second comparing means comprising means for receiving said output from said current sensor means, comparing said output to said second pre-set value, and outputting a fifth signal to said logic means when said output from said current sensor means is greater than said second pre-set value; said logic means outputting a signal to said processor means when said logic means receives said fourth signal or said fifth signal.

21. A method for the detection of and recovery from a plurality of electrical transients in a plasma generator system, wherein said plasma generator system comprises a plasma chamber and a power amplifier, said method comprising:

detecting an electrical transient in said plurality of electrical transients in said plasma generator system;

controlling the output power so as to protect the system;

signaling a processor that said transient has occurred;

sending a signal from said processor to a control system, said signal from said processor to said control system being sent each time a transient is detected in said plurality of transients;

said control system controlling the output of said plasma generator system until said output is stabilized;

said control system outputting a reset signal to said processor; and, said reset signal indicating that said output of said plasma generator is stabilized.

22. The method of claim 21, wherein said step of detecting an electrical transient further comprises the steps of:

detecting said transient in reflected power from the plasma generator;

comparing said detected transient to a pre-set value, and;

signaling said processor that said transient has occurred when said detected transient is greater than said pre-set value.

23. The method of claim 21 wherein said step of detecting an electrical transient further comprises the steps of:

detecting a transient in the supplied current to the plasma generator;

comparing said detected transient to a pre-set value, and;

signaling said processor that said transient has occurred when said detected transient is greater than said pre-set value.

24. The method of claim 21 wherein said step of detecting said electrical transient further comprises the steps of:

- detecting a first transient in said plurality of transients in the reflected power from the plasma generator;
- detecting a second transient in said plurality of transients in the supplied current to the plasma generator;
- comparing said first detected transient to a first pre-set value, and outputting a first output signal to a logical OR gate when said first detected transient is greater than said first pre-set value;
- comparing said second detected transient to a second pre-set value, and outputting a second output signal to a logical OR gate when said second detected transient is greater than said second pre-set value; and
- outputting a third output signal from said logical OR gate to said processor when said logical OR gate receives said first output signal or said second output signal, said third output signal indicating that said transient has occurred.

25. The method of claim 21 wherein the control system comprises control software.

26. The method of claim 21 wherein the control system comprises an analog controller.

* * * * *